United States Patent
Dhanjal (10) Patent No.: US 11,366,174 B2
(45) Date of Patent: Jun. 21, 2022

(54) PREDICTING FAILURES IN FEEDBACK NETWORK OF POWER SUPPLIES USING A SECONDARY SERVO LOOP

(71) Applicant: Analog Devices, Inc., Norwood, MA (US)

(72) Inventor: Navdeep Singh Dhanjal, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 17/018,779

(22) Filed: Sep. 11, 2020

(65) Prior Publication Data
US 2022/0082633 A1    Mar. 17, 2022

(51) Int. Cl.
*G01R 31/40* (2020.01)
*G01R 19/165* (2006.01)
*G01R 19/10* (2006.01)
*H03K 5/24* (2006.01)

(52) U.S. Cl.
CPC ............. *G01R 31/40* (2013.01); *G01R 19/10* (2013.01); *G01R 19/16576* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 7,501,801 B2 | 3/2009 | Brown et al. | |
| 2013/0113445 A1* | 5/2013 | Cai | H02M 3/158 323/265 |
| 2014/0077775 A1 | 3/2014 | Gotou | |
| 2017/0089969 A1 | 3/2017 | Igarashi et al. | |

FOREIGN PATENT DOCUMENTS

CN        114189149 A        3/2022

OTHER PUBLICATIONS

"European Application Serial No. 21194576.1, Extended European Search Report dated Feb. 16, 2022", 8 pgs.

* cited by examiner

*Primary Examiner* — Jas A Sanghera
(74) *Attorney, Agent, or Firm* — Schwegman Lundberg & Woessner, P.A.

(57) ABSTRACT

A device to predict failure in a power supply includes a converter circuit configured to generate a regulated output voltage. The device additionally includes a first feedback circuit to generate a first feedback voltage proportional to the regulated output voltage and a second feedback circuit to generate a second feedback voltage based on the regulated output voltage. The second feedback circuit includes a voltage sampling circuit to detect the regulated output voltage, a correction circuit to generate a correction signal responsive to a voltage difference between the regulated output voltage and a specified output voltage, a reference circuit to obtain a specified correction signal to apply to the power supply, a comparator circuit to determine whether a difference between the generated correction signal and the specified correction signal exceeds a threshold signal value, and an alerting circuit to generate an alert signal responsive to the determination.

20 Claims, 4 Drawing Sheets

PREDICTING FAILURES IN FEEDBACK NETWORK OF POWER SUPPLIES USING A SECONDARY SERVO LOOP

FIELD OF THE DISCLOSURE

This document pertains generally, but not by way of limitation, to electrical power supplies and, more particularly, to predicting failures in power supply circuits.

BACKGROUND

Electronic systems include power supply circuits that are configured to provide regulated power, such as regulated voltages, to loads that is configured perform specific functions. The more robust examples of these power supply circuits operate in closed loop configurations where information regarding the output of the power supply circuits is fed back to input circuit components to control the output of power supply. In an example, a power supply circuit that is configured to provide a constant output voltage over a range of loading conditions can include a feedback circuit (hereinafter, "primary feedback circuit") that generates a feedback voltage that is proportional to the output voltage to a feedback node of the power supply. Input circuits or control components circuit compare the feedback voltage to a reference signal, such as a reference voltage, and adjusts the output voltage based on the comparison. In an example, the output voltage of a power supply circuit can be adjusted to maintain an indicated voltage level. Some power supply circuits can be configured with a second feedback circuit (hereinafter, "secondary feedback circuit") to perform margining operations or to trim or make fined tuned adjustments to the output of the power supply circuit. An example of such a power supply is discussed in U.S. Pat. No. 6,697,952B1, which is titled "Margining Processor Power Supply" and was issued to Joseph D. King on Feb. 24, 2004 and U.S. Pat. No. 7,501,801B2, which is titled "Power Supply Output Voltage Trimming" and was issued to David Alan Brown et al. on Mar. 10, 2009. The '952 patent discusses techniques that may be used to "compensate a voltage regulator that is not outputting the supply voltage required by the computer system", while the '801 patent discusses "trimming the output voltage of a power supply, such as a DC-DC converter or voltage regulator".

SUMMARY OF THE DISCLOSURE

A device to predict failure in a power supply can include a converter circuit configured to generate a regulated output voltage at an output terminal. The device can additionally include a first feedback circuit to generate a first feedback voltage proportional to the regulated output voltage and a second feedback circuit to generate a second feedback voltage based on the regulated output voltage. The second feedback circuit can include a voltage sampling circuit to detect the regulated output voltage and a correction circuit to generate a correction signal responsive to a voltage difference between the regulated output voltage and a specified output voltage. The second feedback circuit can additionally include a reference circuit to obtain, based on the specified output voltage, a specified correction signal to apply to the power supply. The second feedback circuit can further include a comparator circuit to determine whether a magnitude of a difference between the generated correction signal and the specified correction signal exceeds a threshold signal value and an alerting circuit to generate an alert signal responsive to the difference between the generated correction signal and the specified correction signal exceeding the threshold signal value.

A system to predict failure of a power supply caused by degradation of a feedback network can include a power supply circuit that is configured to generate an indicated output voltage, the power supply circuit comprising a feedback network that is configured to adjust an output voltage of the power supply circuit to meet the indicated output voltage, where the feedback network comprising an input node that is coupled to an output terminal of the power supply circuit and an output node that is coupled to a feedback terminal of the power supply circuit. The system can further include a correction circuit comprising a first circuit that is configured to provide a correction signal to the feedback terminal to provide a further adjustment of the output voltage of the power supply circuit to meet the indicated output voltage, and a second circuit that is configured to generate, based on the correction signal meeting an indicated threshold value, a status signal that is indicative of degradation of a component of the feedback network.

A method of predicting failure on a power supply can include determining a voltage difference between an output voltage of a power supply and a target output voltage of the power supply and applying a correction signal to a feedback node of the power supply based on the voltage difference between the output voltage of the power supply and a target output voltage of the power supply. The method can additionally include obtaining, based on the target output voltage, a target correction signal to apply to the power supply and determining whether a difference between the applied correction signal and the target correction signal exceeds a threshold signal value. The method can then include generating an alert signal responsive to the difference between the applied correction signal and the target correction signal exceeding the threshold signal value.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure includes techniques for predicting eventual failure of a power supply circuit caused by degradation of components in a primary feedback circuit of the power supply. The degradation of these components cause drift in a feedback voltage provided by a secondary feedback circuit that is configured to perform margining operations or to trim or make fined tuned adjustments to the output of the power supply circuit. A control circuit in the secondary feedback circuit (e.g., a slow servo loop) is configured to detect the drift in the feedback voltage and characterize the drift to determine whether it is indicative of an eventual failure in the primary feedback circuit. These techniques can provide alerts of power supply circuit failure that might be masked by the corrective actions of the feedback circuits and can therefore inhibit more severe failures in systems that use the power supply circuits. In an example, the technique described in the present disclosure are particularly useful in systems that utilize a large number of power supply circuits, such as data center boards or large application specific integrated circuits (ASICs) that include 10-150 power supply circuits.

A power supply circuit can include a primary feedback circuit that is configured with one or more components that generate a feedback voltage that is proportional to an output voltage of the power supply circuit a feedback node power the power supply. In an example a feedback circuit can include a network or resistors that form a voltage divider so as to divide the output voltage of the power supply by a specified ratio and feedback the result a feedback node of the power supply for comparison to a reference signal. The feedback circuit, or one or more components in the feedback circuit, can gradually degrade and, over time, cause the power supply circuit to fail. In some applications, the power supply circuit includes a secondary feedback loop that is configured to adjust or trim the output voltage of the power supply to compensate for the drift caused by the failing primary feedback circuit. In an example, the secondary feedback circuit monitors the output voltage of the power supply circuit and apply a voltage at the feedback node to adjust the output voltage to compensate for differences between the output voltage and a specified reference voltage. While the secondary feedback circuits can compensate for variations between the output voltage and a reference voltage, this circuit generally cannot prevent the eventual failure of the power supply circuit due to degradation in primary feedback circuit. The secondary feedback circuit tends to mask degradation of components in the primary feedback loop.

Examples of the present disclosure include techniques (e.g., devices, systems, and methods) for predicting eventual failure of a power supply circuit due to degradation of one or more components in the primary feedback circuit based on a feedback signal, such as feedback voltage, provided by a secondary feedback circuit. In an example, a power supply circuit includes a direct current to direct current (DC-to-DC) converter. The DC-to-DC converter has an output node for providing a regulated output voltage and a feedback node for receiving a regulated or adjusted version of the output voltage (hereinafter, "feedback voltage" or "feedback signal"). A primary feedback circuit including one or more electrical components are couples the output node to the feedback node. The primary feedback circuit is configured to generate a first feedback signal to cause the DC-to-DC converter to adjust the output voltage responsive to instantaneous changes in the output voltage. A secondary feedback circuit is coupled between the output node and the feedback node to generate a second feedback signal, or the output voltage, responsive to slow or persistent changes in the output voltage, such as a voltage offset from a reference. In an example, second feedback circuit samples the output voltage of the DC-to-DC converter and compares the sampled output voltage with a specified or predetermined output voltage of the converter to determine a feedback voltage to apply at the feedback node as the second feedback signal. In an example, the determined feedback voltage is a voltage difference between the sampled output voltage of the DC-to-DC converter and the specified output voltage. The determined feedback voltage is then compared to a specified or predetermined feedback voltage to identify a variation the determined feedback voltage that is indicative of an impending failure in the power supply circuit, such as due to degradation of a component in the primary feedback circuit. In an example, the specified feedback voltage is determined based on the specified output voltage of the DC-to-DC converter or based the values or tolerance of one or more components of the primary feedback circuit. The determined feedback voltage exceeding, or drifting above, the specified feedback voltage can be indicative of the secondary feedback network compensating for failing component in the primary feedback circuit. The amount by which the determined feedback voltage exceeds, or drifts away from, the specified feedback voltage can be indicative of the likelihood of power supply failure.

Figure 1:
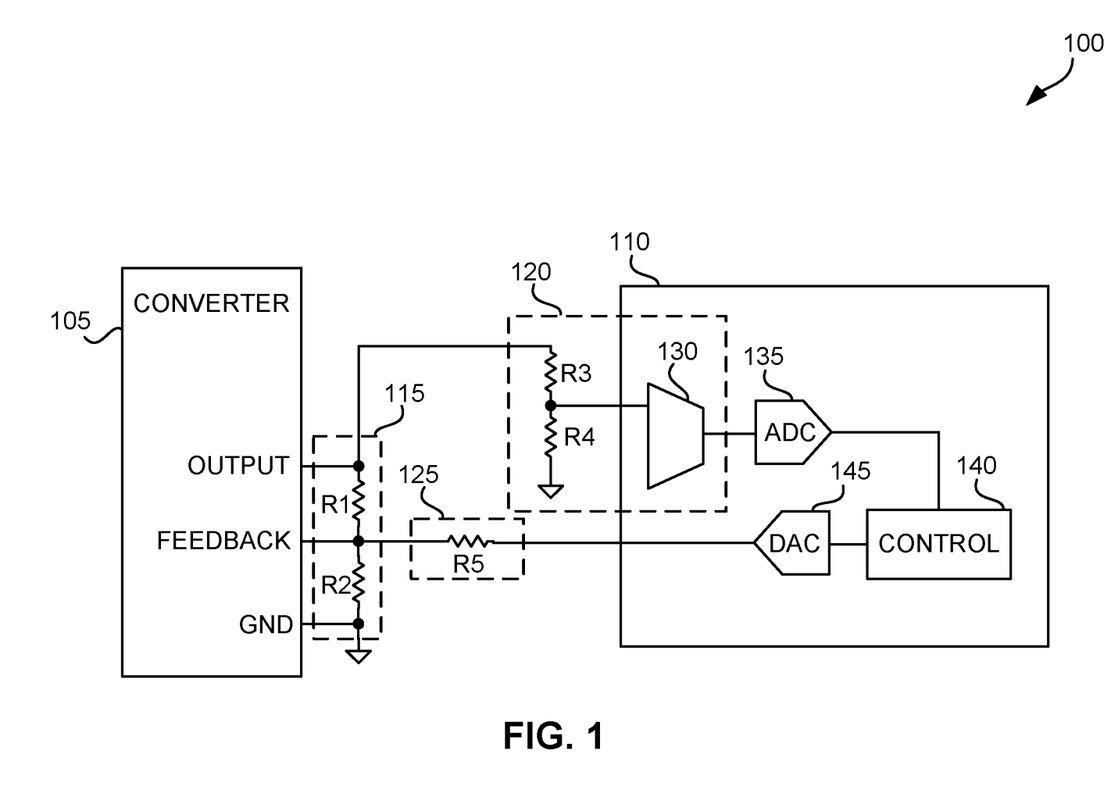
FIG. 1 illustrates an example of a power supply circuit that is configured to predict failures in a feedback network of the power supply circuit.

FIG. 1 illustrates an example of a power supply circuit 100 that is configured to predict failures in a feedback network 115 of a power supply. In an example, the power supply circuit 100 includes a converter circuit 105, the primary feedback circuit 115, and a secondary feedback circuit 110. The power supply circuit 100 can be used in an electronic system to provide regulated power to one or more electronic circuits and to provide an indicator of the likelihood of a power supply failure. In an example, the indicator includes a signal or electronic data to indicate that a component of the feedback circuit 115, such as resistor R1 or resistor R2, is degraded or is likely to fail.

The converter circuit 105 can include any power converter circuit, such as DC-to-DC converter or a voltage regulator, that is configured to operate in a closed loop configuration to provide or maintain a regulated output voltage. The regulated output voltage can be generated at an output node OUTPUT based on an input power supply (not shown) and feedback received at feedback node FEEDBACK. In an example, the converter circuit 105 is configured to receive a feedback signal at FEEDBACK and to adjust the regulated output voltage based on the received feedback signal and a reference signal so as to maintain the regulated output voltage.

The primary feedback circuit 115 can include a circuit that is coupled to node OUTPUT and node FEEDBACK to generate or provide, at node FEEDBACK, a first feedback signal that is proportional to or indicative of the output voltage of the power supply. The feedback circuit 115, for example, includes a passive component network, such a network of resistor R1 and resistor R1 that form a voltage divider to provide a scaled version of the output voltage of the converter 105 at the feedback node as the first feedback signal. In an example, the primary feedback circuit 115 is configured to continually provide the first feedback signal at the feedback node. In another example, the primary feedback network is configured to adjust the first feedback signal responsive to changes in the output voltage of the converter 105. Such adjustments can be made in response to instantaneous or near instantaneous changes in the output voltage.

The secondary feedback circuit 110 can include a margining or trim control circuit that is configured to provide a second feedback signal at node FEEDBACK to adjust the output voltage of the converter circuit 105. In an example, the secondary feedback circuit 110 is configured to provide the second feedback signal responsive to persistent, long lasting, or slow changes in the output voltage of the converter circuit 105. Such changes can include variations in the output voltage, such as a voltage offset, the persists for one or more milliseconds. In another example, the second feedback circuit 110 is configured to provide the second feedback signal to cause the converter circuit 105 to generate an output voltage a specified voltage level. In yet another example, the secondary feedback circuit 110 is configured to make higher resolution, or finer grained, adjustments to the output voltage of the converter circuit 105 than the primary feedback circuit is capable of, such as by causing higher resolution, or finer grained, adjustments in the second feedback signal than are present in the first feedback signal.

The secondary feedback circuit 110 can include an analog-to-digital converter (ADC) 135, a control circuit 140 and a digital-to-analog converter (DAC) 145. The secondary feedback circuit 110 can also include a coupling circuit 120 that has a multiplexer 130 and a conditioning circuit, such as a voltage divider formed by resistors R3 and R4. The ADC 135 includes a circuit that is configured to obtain a sample of the output voltage of the converter 105 and to provide a digital version of the sample to the controller circuit 140. The DAC 145 include a circuit that is configured to receive a digital output signal from the control circuit 140 and provide, based on the digital output signal, a feedback signal, such as the second feedback signal, to the converter 105. In an example, the output of the DAC 145 includes an analog voltage that is coupled, such as through the resistor R5, to the converter 105. In another example, the output of the DAC 145 is provided to pulse width modulation (PWM) generator circuit (not shown) to generate a PWM signal. The PWM signal is then converted to a voltage, such as by providing the signal to a capacitor (not shown) disposed in parallel between resistor R2 and GND and applied to the node FEEDBACK.

The coupling circuit 120 can include a circuit that is configured to interface the secondary feedback circuit 110 with the converter 105. In an example, the coupling circuit includes a voltage divider formed resistors R3 and R4 to adjust the output voltage of the power supply circuit to suitable voltage level for the secondary feedback back circuit. In another example, the power supply circuit 100 includes two more converter circuits 105, and the coupling circuit 120 includes a multiplexer 130 that is configured to selectively couple, such as through operation of a device control circuit (not shown), an output of two or more converters to the ADC 135. As shown in FIG. 1, one or more components of the coupling circuit 120 can be a discrete circuit or can be incorporated into the converter 105 or into the secondary feedback circuit 110.

The control circuit 140 can include a circuit that is configured to predict, or indicate likelihood of, a power supply failure, such as due to degradation or failure of a component in the primary feedback circuit 115. In an example the control circuit 140 includes a microcontroller, a programmable gate array, an ASIC, or other suitable logic or processing circuit. In operation, the control circuit 140 receives a digital signal from the ADC 135 that is indicative of the output voltage of the converter 105. The control circuit 140 compares, based on the digital signal, the output voltage of the converter 105 to a specified output voltage, such as a nominal or target output voltage of the converter. The nominal or target output voltage is an output voltage that the converter 105 is configured to provide at node OUPUT while the converter is operating within its designed or prescribed margin of operation. In an example, the specified output voltage is stored in a memory circuit or generated by another circuit associated with the control circuit secondary feedback look 110. In an example, the control circuit 140 obtains, such as by retrieving from a memory circuit, the specified output voltage (e.g., a digital value that indicative of the specified output voltage) into the memory any time during or prior to operation of the power supply circuit 100. The control circuit 140 then determines the second feedback voltage to provide to the converter 105. In an example, the control circuit 140 determines the value of the feedback voltage by determining a voltage difference between the specified output voltage of the converter 105 and the sampled output voltage of the converter. The control circuit 140 then provides the second feedback voltage to converter circuit 105. In an example, the control circuit 140 provides digital data that is indicative of the second feedback voltage at the DAC 145 and the DAC converts the digital data to an analog signal and provides the resulting signal to the converter 105 at node FEEDBACK. In yet another example, the control circuit 140 provides digital data that is indicative of the second feedback voltage at a PWM circuit and the PWM circuit generates, responsive to the digital data, a PWM signal that may then be converted to an analog signal, such as by using a capacitor as described herein, and provided to the converter 105 at node FEEDBACK.

In a fault monitoring operating mode, the control circuit 140 uses the specified output voltage of the converter 105 to determine a specified feedback signal to provide at node FEEDBACK. In an example, the specified feedback signal is a feedback voltage that the control circuit 140 is configured to provide at node FEEDBACK as the second feedback signal for a specified output voltage configuration of the converter 105 if the primary feedback network was operating within its designed or prescribed margins of operation or if components of the primary feedback circuit 115 were operating normally without degradation. The control circuit 140 then compares the specified feedback signal to the second feedback signal provided to the converter 105 to determine whether the first feedback circuit 115, or a component of the first feedback circuit, is likely to fail. In an example, the control circuit 140 determines whether the first feedback circuit 115 is likely to fail by determining that the second feedback signal is drifting away from the specified feedback signal. In an example, the control circuit 140 determines whether the first feedback circuit 115 is likely to fail by determining a signal difference between the second feedback signal and the specified feedback signal and comparing the determined difference to specified threshold signal value. Determining the signal difference can include determining a voltage difference between the second feedback signal and the specified feedback signal and comparing this voltage difference to specified high and low voltage threshold values. Such threshold values can be determined using any suitable power supply failure analysis and characterization technique. Continuing the previous example, the control circuit 140 can generate an alert when the determined voltage difference rises above the high threshold value or falls below the low threshold value. In an example, the control circuit 140 generates the alert by storing a flag or other data that is indicative of the alert in a memory register or other memory or storage circuit. In another example, the control circuit 140 generates the alert by transmitting an alert signal, such as a flag or other data that is indicative of the alert, over a communication interface to the control circuit 140, the secondary feedback circuit 110, or the power supply circuit 100.

In another example, one or more of the voltage or signal values described herein can be associated with one or more threshold or margin values, such as for defining margin of operation within which an adjusting or alerting operation may be delayed or inhibited. Such voltage or signal values can be obtained dynamically during operation of the power supply circuit 110, stored a memory of the power supply circuit, or hardwired in one or more circuits of the power supply circuit. Values for resistors R1-R5 can be obtained or determined using any suitable technique for biasing the node FEEBACK or the input the feedback circuit 110. One or more for the circuits that include any of the resistors R1-R5 can include other circuit components, such as a capacitor or an inductor, that are coupled the resistors or that operate as a substitute component for the resistors.

Figure 2A:
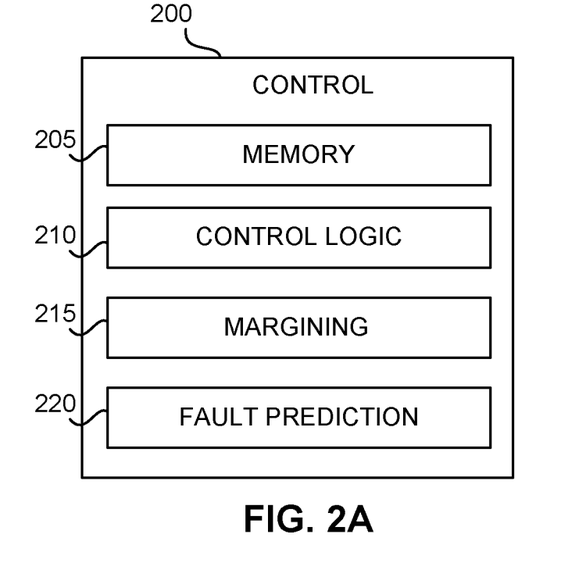
FIG. 2A illustrates an example of components of a control circuit that is configured to predict failures in a feedback network of a power supply circuit.

FIG. 2A illustrates an example of components of a control circuit 200 that is configured to predict failures in feedback circuit of a power supply circuit, such as the power supply circuit 100. The control circuit 200 can include the control circuit 140 and may be configured to predict failures in the primary feedback circuit 115 of the converter 105. As shown in FIG. 2A, the control circuit 200 can include memory 205, control logic component 210, margining component 215, fault prediction component 220.

In an example, the memory 205 is configured to store any electronic signals, data, or data structures (hereinafter, "electronic data") that are useful for implementing the operations of the control circuit 200 or the control circuit 140. Such electronic data can include data that correspond to specified or predetermined output voltage values of the power supply circuit, specified feedback signal values of the secondary feedback circuit 110, or threshold voltage values used as a condition for generating a failure alert, such as described in the discussion of FIG. 1. Such data structures can include registers, arrays, files, tables, or databases that associate, store, or organize the electronic data according to a specified relationship. In an example, the data structures can include a table or database that associates a specified output voltage of the power supply circuit with a nominal or specified feedback value to be provided by the control circuit 200. The electronic data and data structures can include any suitable computer executable code or logic sequences for implementing the techniques described herein.

The control logic component 210 can include any logic circuit that is configured to execute computer executable code or logic sequences for implementing the techniques described herein. In an example, the control logic component 210 is configured, such as by computer code or logic sequences stored in the memory 205 or preprogrammed into the control logic, to cause the margining component 215 to obtain digital data that is indicative of the output voltage of the converter 105 from the ADC 135, compare the digital data to a specified output voltage stored in the memory 205, and provide a digital feedback signal to the DAC 145 to adjust the output voltage of the power supply to compensate for a difference (e.g., a long lasting difference) between the power supply output voltage and the specified output voltage. In another example, the control logic component 210 is configured to cause the fault prediction component 220 to obtain, based on a specified output voltage of the converter 105, a corresponding specified feedback signal of the secondary feedback circuit 110 and threshold signal values from the memory 230, compare a difference between the specified feedback signal and the feedback signal provided to power supply circuit to the threshold signal values, and generate an alert based on the comparison.

Figure 2B:
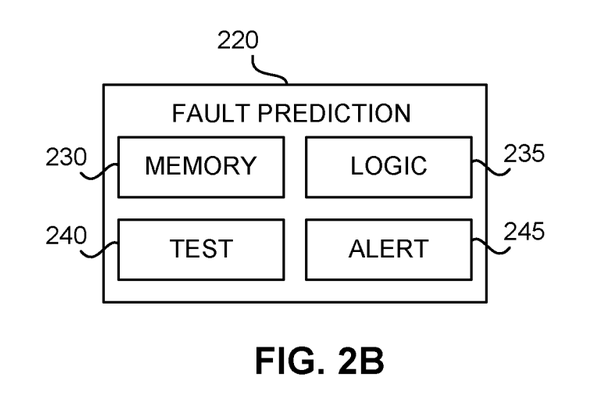
FIG. 2B illustrates an example of components of a fault prediction component of a control circuit that is configured to predict failures in a feedback network of the power supply circuit.

FIG. 2B illustrates an example of components of the fault prediction component 220. The fault prediction component 220 can include memory 230, control logic component 235, testing component 240 and alerting component 245. The memory 230 can include distinct memory circuits or portion of the memory 205 that is configured to store electronic data or data structures that are suitable for implementing the fault prediction techniques described herein. In addition to any of the previously discussed electronic data or data structures, the memory 230 can include storage registers, data arrays, or other memory components that are configured to store an alert signal or electronic data that is indicative of the alert signal. In an example, the alert signal is a 1-bit binary flag and the memory 230 includes a memory register having a bit position reserved for the flag. The control logic component 235 include a logic circuit, a logic sequence, or a software application that is configured to control the operation of testing component 240 and alerting component 245 to implement the fault detection techniques described herein. The testing component 240 can include a comparator circuit or software application that is configured to determine whether a voltage difference a feedback signal provided by the secondary feedback circuit 110 (e.g., an applied correction signal) and a specified feedback signal determined based on a specified operating voltage of the converter 105 (e.g., a target or ideal correction signal) meets or exceeds a threshold signal value or whether such a voltage difference is outside of specified high and low thresholds. The alerting component 245 can include a circuit or software application that is configured to generate an alert signal responsive to a difference between the feedback signal provided by the secondary feedback circuit 110 and the specified feedback signal meeting or exceeding the threshold signal value or being outside of the specified high and low thresholds.

Figure 3:
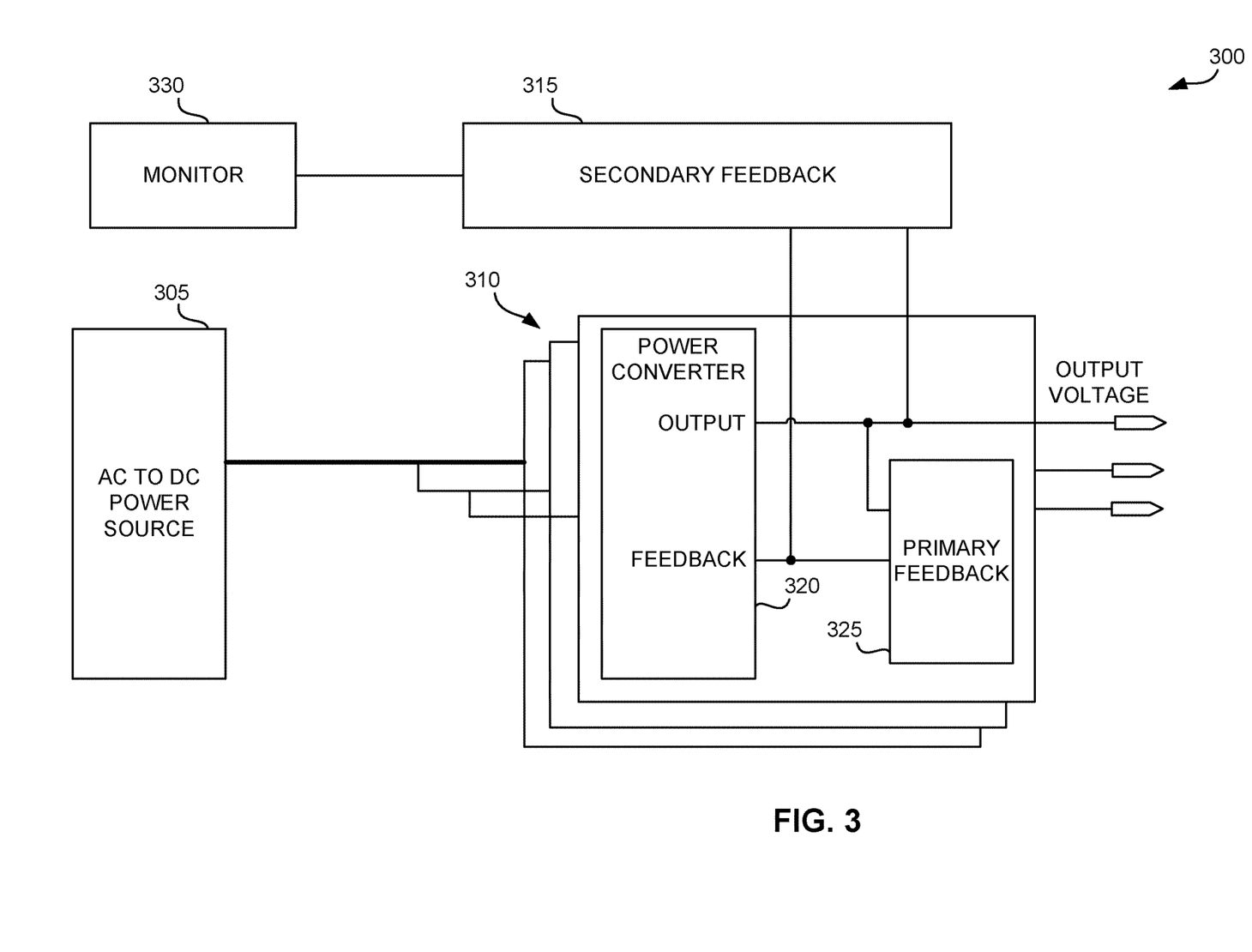
FIG. 3 illustrates an example of a system that includes a power supply circuit that is configured to predict failures in a feedback circuit.

FIG. 3 illustrates an example of a system 300 that includes a power supply 310 that is configured to predict failures in primary feedback circuit 325. In an example, the system 300 is a component of a data center board, large ASIC, or any other suitable system. In an example, the system 300 includes a power source 305 that is coupled to one or more power supply circuits 310, such as the power supply 100. One or more of the power supply circuits 310 can include a converter 320 and a secondary primary feedback circuit 325. The converter 320 is an example of the converter 105, while the primary feedback circuit 325 is an example of the primary feedback circuit 115. One or more of the power supply circuits 310 are coupled to a secondary feedback circuit 315, such as by multiplexed connections between an output node of the power supply circuits and a feedback node of the power converter. In operation, the power source 305 provides a DC power in a first power domain to one or more of the power supply circuits 310. The power supply circuits 310 convert the power provided by the power source 305 to a second domain, such as by generating a specified regulated DC voltage through closed loop operation of the converter 320 and the primary feedback circuit 325. The secondary feedback circuit 315 interfaces with the one or more power supply circuits 310, such as through sequential switching through multiplexed connections to output nodes of each converter 320, to provide a power supply margining or trimming operation. Such margining or trimming operation can include sampling the output voltage of the converter 320 and providing a feedback signal, such as a feedback voltage, to cause the converter to adjust the voltage level of its output voltage. The secondary feedback circuit 315 also monitors the provided feedback signal to detect any drift or deviation in the feedback signal, such as away from a specified or nominal feedback signal, that may be indicative of a likelihood of eminent failure of one or more components in the primary feedback network. The secondary feedback circuit 315 compares such drift or the deviation to specified threshold or margin values and provides an alert to a monitoring circuit 330 responsive to the drift or deviation exceeding, or being outside of, the thresholds or margin.

Figure 4:
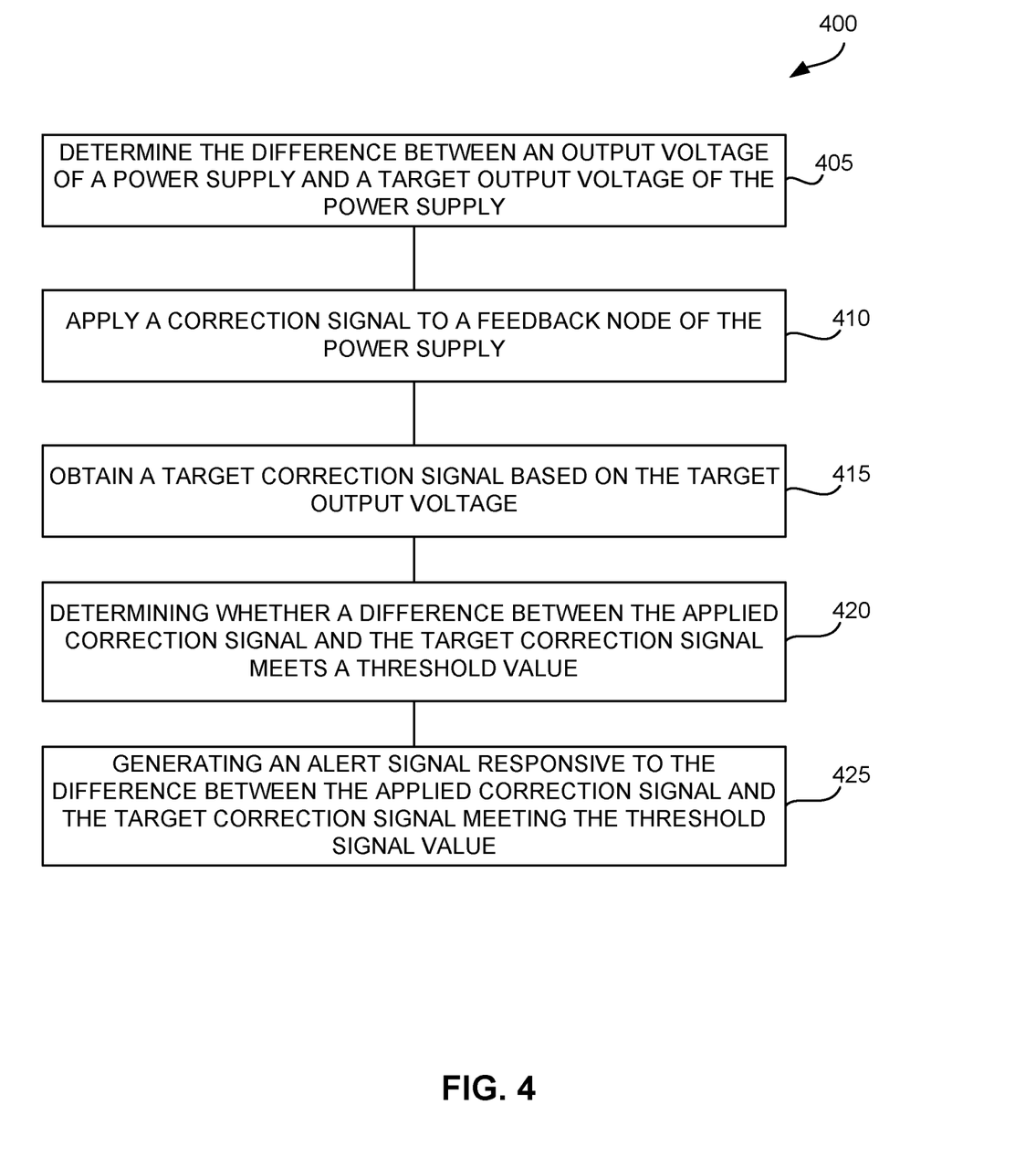
FIG. 4 illustrates an example of a process for operating a power supply circuit that is configured to predict failures in a feedback network of the power supply.

FIG. 4 illustrates an example of a process 400 for operating a power supply that is configured to predict failures in feedback network of the power supply. The process 400 can be executed or performed to implement any of the techniques described in the discussion of FIGS. 1-3. In an example, the process 400 is executed by margining or trimming circuit, such as secondary feedback circuit 110 or 315. At 405, a signal difference or voltage between an output voltage of the power supply and a target or specified output voltage is determined. In an example the signal difference is determined by sampling the output voltage, such as by using an analog to digital converter circuit and obtaining the signal difference between to the sampled output voltage and the target output voltage. At 410, a correction signal is applied to a feedback node of the power supply responsive to or based on the obtained difference. The correction signal may include, or may be determined based on, the signal difference between the sampled output voltage and the target output voltage. In an example, the correction signal is configured to reduce the signal difference between output voltage of the power supply and the target output voltage. At 415, a target correction signal is obtained based on the target output voltage of the power supply. In an example, the target correction signal includes a correction signal that would be applied to feedback node of the power supply under nominal or normal operation for power supply, such as when there is no degradation in a primary feedback circuit of the power supply. In an example, the target correction signal is obtained from a lookup table that associates target output voltages or specified primary feedback network components of the power supply with target correction signals. In another example the target correction signal is hardwired in one or more circuits. At 420, a signal difference between the correction signal applied to the power supply and the target correction signal is obtained and used determine whether this signal difference meets or exceeds a threshold signal value, such exceeding or being larger than a specified high threshold or being smaller than a low signal threshold. At 425, an alert signal is generated responsive to the signal difference between the correction signal applied to the power supply and the target correction signal meeting or exceeding the threshold signal value.

The process 400 can include any other operation that is suitable for implementing the techniques described herein.

Various Examples

Example 1 is a device to predict failure in a power supply, the device comprising: a converter circuit configured to generate a regulated output voltage at an output terminal; a first feedback circuit to generate a first feedback voltage proportional to the regulated output voltage; a second feedback circuit to generate a second feedback voltage based on the regulated output voltage, the second feedback circuit comprising: a voltage sampling circuit to detect the regulated output voltage; a correction circuit to generate a correction signal responsive to a voltage difference between the regulated output voltage and a specified output voltage; a reference circuit to obtain, based on the specified output voltage, a specified correction signal to apply to the power supply; a comparator circuit to determine whether a magnitude of a difference between the generated correction signal and the specified correction signal exceeds a threshold signal value; and an alerting circuit to generate an alert signal responsive to the difference between the generated correction signal and the specified correction signal exceeding the threshold signal value.

In Example 2, the subject matter of Example 1 includes, wherein the voltage sampling circuit comprises an analog to digital converter (ADC) circuit that is configured to obtain a digital sample of the output voltage and to provide the digital sample to the second feedback circuit.

In Example 3, the subject matter of Examples 1-2 includes, wherein the feedback circuit comprises a resistor network that is configured to obtain the output voltage generate the first feedback voltage proportional to the regulated output voltage a feedback node of the converter circuit to adjust the regulated output voltage to meet a target output voltage.

In Example 4, the subject matter of Examples 1-3 includes, wherein the correction circuit comprises an analog-to-digital converter to generate the correction signal.

In Example 5, the subject matter of Examples 1-4 includes, wherein the correction circuit comprises a pulse width modulation circuit or a digital-to-analog converter circuit to generate the correction signal.

In Example 6, the subject matter of Examples 1-5 includes, wherein the reference circuit is configured to obtain the specified correction signal based on the specified output voltage and an electrical value of one or more elements of the first feedback circuit.

In Example 7, the subject matter of Examples 1-6 includes, wherein to generate the alert signal responsive to the difference between the generated correction signal and the specified correction signal exceeding the threshold signal value, the alerting circuit is configured to store a signal value in a memory circuit of the device, the signal value being indicative of the difference between the generated correction signal and the specified correction signal exceeding the threshold signal value.

In Example 8, the subject matter of Examples 1-7 includes, wherein to generate the alert signal responsive to the difference between the generated correction signal and the specified correction signal exceeding the threshold signal value, the alerting circuit is configured to transmit a signal value over an interface to the device to another device, the signal value being indicative of the difference between the generated correction signal and the specified correction signal exceeding the threshold signal value.

In Example 9, the subject matter of Examples 1-8 includes, wherein the first feedback circuit and the second feedback circuits are coupled to an output node of the converter circuit and to a feedback node of the converter circuit.

In Example 10, the subject matter of Examples 1-9 includes, wherein the first feedback circuit is configured to adjust the generated feedback voltage responsive on instantaneous value of the output voltage, and the second feedback circuit is configured to adjust the correction signal responsive to an average value of the output voltage.

Example 11 is a system to predict failure of a power supply caused by degradation of a feedback network, the system comprising: a power supply circuit that is configured to generate an indicated output voltage, the power supply circuit comprising a feedback network that is configured to adjust an output voltage of the power supply circuit to meet the indicated output voltage, the feedback network comprising an input node that is coupled to an output terminal of the power supply circuit and an output node that is coupled to a feedback terminal of the power supply circuit; and a correction circuit comprising: a first circuit configured to provide a correction signal to the feedback terminal to provide a further adjustment of the output voltage of the power supply circuit to meet the indicated output voltage, and a second circuit configured to generate, based on the correction signal meeting an indicated threshold value, a status signal that is indicative of degradation of a component of the feedback network.

In Example 12, the subject matter of Examples 9-11 includes, wherein the correction circuit is configured to generate the correction signal based on a voltage difference between the output voltage of the power supply circuit and the indicated output voltage.

In Example 13, the subject matter of Example 12 includes, wherein the second circuit is configured to generate the status signal based on a difference between the correction signal provided by the first circuit and a specified correction signal.

In Example 14, the subject matter of Example 13 includes, wherein correction circuit is configured to obtain the specified correction signal based on the indicated output voltage of the power supply circuit.

In Example 15, the subject matter of Examples 13-14 includes, wherein the status signal is indicative of degradation of a resistor or a capacitor in the feedback network.

In Example 16, the subject matter of Examples 12-15 includes, wherein the correction signal is a digital signal having a time varying pulse width that is modulated based on the difference between the output voltage of the power supply and the indicated output voltage.

In Example 17, the subject matter of Examples 11-16 includes, wherein the correction signal is an analog signal having a time varying amplitude that is modulated based on the difference between the output voltage of the power supply and the indicated output voltage.

In Example 18, the subject matter of Examples 11-17 includes, wherein the feedback circuit is configured to adjust the output voltage of the power supply circuit at a faster rate than a rate at which the first circuit provides the further adjustment of the output voltage of the power supply circuit.

Example 19 is a method of predicting failure on a power supply, the method comprising: determining a voltage difference between an output voltage of a power supply and a target output voltage of the power supply; applying a correction signal to a feedback node of the power supply based on the voltage difference between the output voltage of the power supply and a target output voltage of the power supply; obtaining, based on the target output voltage, a target correction signal to apply to the power supply; determining whether a difference between the applied correction signal and the target correction signal exceeds a threshold signal value; and generating an alert signal responsive to the difference between the applied correction signal and the target correction signal exceeding the threshold signal value.

In Example 20, the subject matter of Example 19 includes, wherein the power supply comprises a feedback circuit including a resistor network, determining a voltage difference between an output voltage of a power supply and a target output voltage of the power supply comprises sampling, using an analong-to-digital converter circuit, the output voltage of the power supply at a first node of the feedback circuit; and applying the correction signal to the feedback node of the power supply comprises converting digital data that indicative of the correction signal to an analog voltage and providing the analog voltage at a second node of the feedback circuit.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include components in addition to those shown or described. However, the present inventors also contemplate examples in which only those components shown or described are provided. Moreover, the present inventors also contemplate examples using any combination or permutation of those components shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes components in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A device to predict failure in a power supply, the device comprising:
a converter circuit configured to generate a regulated output voltage at an output terminal;
a first feedback circuit to generate a first feedback voltage proportional to the regulated output voltage;
a second feedback circuit to generate a second feedback voltage based on the regulated output voltage, the second feedback circuit comprising:
a voltage sampling circuit to detect the regulated output voltage;
a correction circuit to generate a correction signal responsive to a voltage difference between the regulated output voltage and a specified output voltage;
a reference circuit to obtain, based on the specified output voltage, a specified correction signal to apply to the power supply;
a comparator circuit to determine whether a magnitude of a difference between the generated correction signal and the specified correction signal exceeds a threshold signal value; and
an alerting circuit to generate an alert signal responsive to the difference between the generated correction signal and the specified correction signal exceeding the threshold signal value.

2. The device of claim 1, wherein the voltage sampling circuit comprises an analog to digital converter (ADC) circuit that is configured to obtain a digital sample of the output voltage and to provide the digital sample to the second feedback circuit.

3. The device of claim 1, wherein the first feedback circuit comprises a resistor network that is configured to obtain the output voltage to generate the first feedback voltage proportional to the regulated output voltage of a feedback node of the converter circuit to adjust the regulated output voltage to meet a target output voltage.

4. The device of claim 1, wherein the correction circuit comprises an analog-to-digital converter to generate the correction signal.

5. The device of claim 1, wherein the correction circuit comprises a pulse width modulation circuit or a digital-to-analogic converter circuit to generate the correction signal.

6. The device of claim 1, wherein the reference circuit is configured to obtain the specified correction signal based on the specified output voltage and an electrical value of one or more elements of the first feedback circuit.

7. The device of claim 1, wherein to generate the alert signal responsive to the difference between the generated correction signal and the specified correction signal exceeding the threshold signal value, the alerting circuit is configured to store a signal value in a memory circuit of the device, the signal value being indicative of the difference between the generated correction signal and the specified correction signal exceeding the threshold signal value.

8. The device of claim 1, wherein to generate the alert signal responsive to the difference between the generated correction signal and the specified correction signal exceeding the threshold signal value, the alerting circuit is configured to transmit a signal value over an interface of the device to another device, the signal value being indicative of the difference between the generated correction signal and the specified correction signal exceeding the threshold signal value.

9. The device of claim 1, wherein the first feedback circuit and the second feedback circuits are coupled to an output node of the converter circuit and to a feedback node of the converter circuit.

10. The device of claim 1, wherein the first feedback circuit is configured to adjust the generated feedback voltage responsive on instantaneous value of the output voltage, and the second feedback circuit is configured to adjust the generated correction signal responsive to an average value of the output voltage.

11. A system to predict failure of a power supply caused by degradation of a feedback network, the system comprising:
a power supply circuit that is configured to generate an indicated output voltage, the power supply circuit comprising a feedback network that is configured to adjust an output voltage of the power supply circuit to meet the indicated output voltage, the feedback network comprising an input node that is coupled to an output terminal of the power supply circuit and an output node that is coupled to a feedback terminal of the power supply circuit; and
a correction circuit comprising:
a first circuit configured to provide a correction signal to the feedback terminal to provide a further adjustment of the output voltage of the power supply circuit to meet the indicated output voltage, and
a second circuit configured to generate, based on the correction signal meeting an indicated threshold value, a status signal that is indicative of degradation of a component of the feedback network.

12. The system of claim 11, wherein the correction circuit is configured to generate the correction signal based on a voltage difference between the output voltage of the power supply circuit and the indicated output voltage.

13. The system of claim 12, wherein the second circuit is configured to generate the status signal based on a difference between the correction signal provided by the first circuit and a specified correction signal.

14. The system of claim 13, wherein correction circuit is configured to obtain the specified correction signal based on the indicated output voltage of the power supply circuit.

15. The system of claim 13, wherein the status signal is indicative of degradation of a resistor or a capacitor in the feedback network.

16. The system of claim 12, wherein the correction signal is a digital signal having a time varying pulse width that is modulated based on the voltage difference between the output voltage of the power supply and the indicated output voltage.

17. The system of claim 12, wherein the correction signal is an analog signal having a time varying amplitude that is modulated based on the voltage difference between the output voltage of the power supply and the indicated output voltage.

18. The system of claim 11, wherein the feedback circuit is configured to adjust the output voltage of the power supply circuit at a faster rate than a rate at which the first circuit provides the further adjustment of the output voltage of the power supply circuit.

19. A method of predicting failure on a power supply, the method comprising:

determining a voltage difference between an output voltage of a power supply and a target output voltage of the power supply;

applying a correction signal to a feedback node of the power supply based on the voltage difference between the output voltage of the power supply and a target output voltage of the power supply;

obtaining, based on the target output voltage, a target correction signal to apply to the power supply;

determining whether a difference between the applied correction signal and the target correction signal exceeds a threshold signal value; and generating an alert signal responsive to the difference between the applied correction signal and the target correction signal exceeding the threshold signal value.

20. The method of claim 19, wherein the power supply comprises a feedback circuit including a resistor network, determining a voltage difference between an output voltage of a power supply and a target output voltage of the power supply comprises sampling, using an analog-to-digital converter circuit, the output voltage of the power supply at a first node of the feedback circuit; and applying the correction signal to the feedback node of the power supply comprises converting digital data indicative of the correction signal to an analog voltage and providing the analog voltage at a second node of the feedback circuit.

* * * * *